United States Patent
Rugolo et al.

(10) Patent No.: US 10,805,705 B2
(45) Date of Patent: Oct. 13, 2020

(54) OPEN-CANAL IN-EAR DEVICE

(71) Applicant: X Development LLC, Mountain View, CA (US)

(72) Inventors: Jason Rugolo, Mountain View, CA (US); Carsten Schwesig, San Francisco, CA (US)

(73) Assignee: X Development LLC, Mountain View, CA (US)

( * ) Notice: Subject to any disclaimer, the term of this patent is extended or adjusted under 35 U.S.C. 154(b) by 0 days.

(21) Appl. No.: 16/235,417

(22) Filed: Dec. 28, 2018

(65) Prior Publication Data
US 2020/0213704 A1 Jul. 2, 2020

(51) Int. Cl.
*H04R 1/10* (2006.01)
*H03K 19/173* (2006.01)
*G10L 15/26* (2006.01)

(52) U.S. Cl.
CPC .......... *H04R 1/1016* (2013.01); *G10L 15/265* (2013.01); *H03K 19/1733* (2013.01); *H04R 1/1066* (2013.01)

(58) Field of Classification Search
CPC ... H04R 1/1016; H04R 1/1066; G10L 15/265; H03K 19/1733
See application file for complete search history.

(56) References Cited

U.S. PATENT DOCUMENTS

| 5,800,336 | A | 9/1998 | Ball et al. | |
|---|---|---|---|---|
| 6,275,596 | B1 * | 8/2001 | Fretz | H04R 25/652 |
| | | | | 381/321 |
| 7,421,086 | B2 * | 9/2008 | Bauman | H04R 25/652 |
| | | | | 381/328 |
| 7,570,777 | B1 | 8/2009 | Taenzer et al. | |
| 7,634,099 | B2 | 12/2009 | Harvey et al. | |
| 7,715,581 | B2 * | 5/2010 | Schanz | H04R 25/604 |
| | | | | 381/328 |
| 7,899,200 | B2 * | 3/2011 | Karamuk | H04R 25/656 |
| | | | | 381/328 |
| 8,027,481 | B2 | 9/2011 | Beard | |
| 8,218,799 | B2 * | 7/2012 | Murphy | H04R 1/1016 |
| | | | | 381/309 |
| 9,042,589 | B2 | 5/2015 | Depallens et al. | |
| 10,531,173 | B2 * | 1/2020 | Khaleghimeybodi | G02C 11/06 |

(Continued)

OTHER PUBLICATIONS

U.S. Appl. No. 16/234,999, Tympanic Membrane Measurement, filed Dec. 28, 2018, 31 pages.

(Continued)

*Primary Examiner* — Oyesola C Ojo

(74) *Attorney, Agent, or Firm* — Christensen O'Connor Johnson Kindness PLLC

(57) ABSTRACT

An in-ear device includes a housing shaped to be held in an ear of a user, and be positioned around a canal of the ear so the canal is unobstructed by the in-ear device, and an audio package positioned within the housing to project sound into the canal when the in-ear device is disposed in the ear. A controller is disposed in the housing and coupled to the audio package, and the controller includes logic that when executed by the controller causes the in-ear device to perform operations, including emitting the sound from the audio package towards the canal of the ear.

22 Claims, 4 Drawing Sheets

(56) References Cited

U.S. PATENT DOCUMENTS

| | | | |
|---|---|---|---|
| 2003/0002705 A1* | 1/2003 | Boesen | H04M 1/6066 381/380 |
| 2003/0231783 A1* | 12/2003 | Kah, Jr. | A61F 11/008 381/322 |
| 2005/0111686 A1* | 5/2005 | Bayer | H04R 25/652 381/330 |
| 2006/0067556 A1* | 3/2006 | Bailey | H04R 1/105 381/380 |
| 2007/0003085 A1* | 1/2007 | Meier | H04R 25/652 381/328 |
| 2007/0054703 A1* | 3/2007 | Ryann | H04M 1/6066 455/569.1 |
| 2008/0025539 A1* | 1/2008 | Bailey | H04R 25/75 381/322 |
| 2008/0123888 A1* | 5/2008 | Schanz | H04R 25/656 381/328 |
| 2009/0252362 A1* | 10/2009 | Ooi | H04R 25/65 381/328 |
| 2011/0075871 A1* | 3/2011 | Fretz | H04R 25/656 381/321 |
| 2011/0250932 A1* | 10/2011 | Cohen | H04R 25/505 455/569.1 |
| 2012/0070028 A1* | 3/2012 | Margulies | H04R 1/105 381/380 |
| 2015/0201291 A1* | 7/2015 | Harris | H04R 1/105 381/328 |
| 2015/0228292 A1* | 8/2015 | Goldstein | G10L 21/0208 381/71.6 |
| 2016/0134957 A1* | 5/2016 | Jentz | H04R 1/105 381/380 |
| 2017/0216673 A1* | 8/2017 | Armstrong | H04R 1/1016 |
| 2018/0160213 A1* | 6/2018 | Grinker | G10K 11/17873 |
| 2019/0042565 A1* | 2/2019 | Choi | G10L 25/69 |

OTHER PUBLICATIONS

U.S. Appl. No. 16/235,360, Transparent Sound Device, filed Dec. 28, 2018, 29 pages.

U.S. Appl. No. 16/235,092, Optical Otoscope Device, filed Dec. 28, 2018, 27 pages.

U.S. Appl. No. 16/176,660, Modular In-Ear Device, filed Oct. 31, 2018, 30 pages.

* cited by examiner

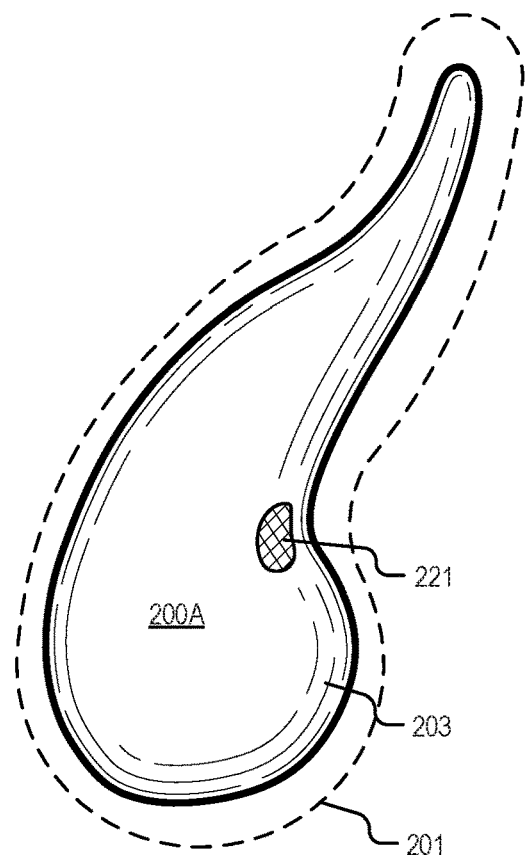
FIG. 2A
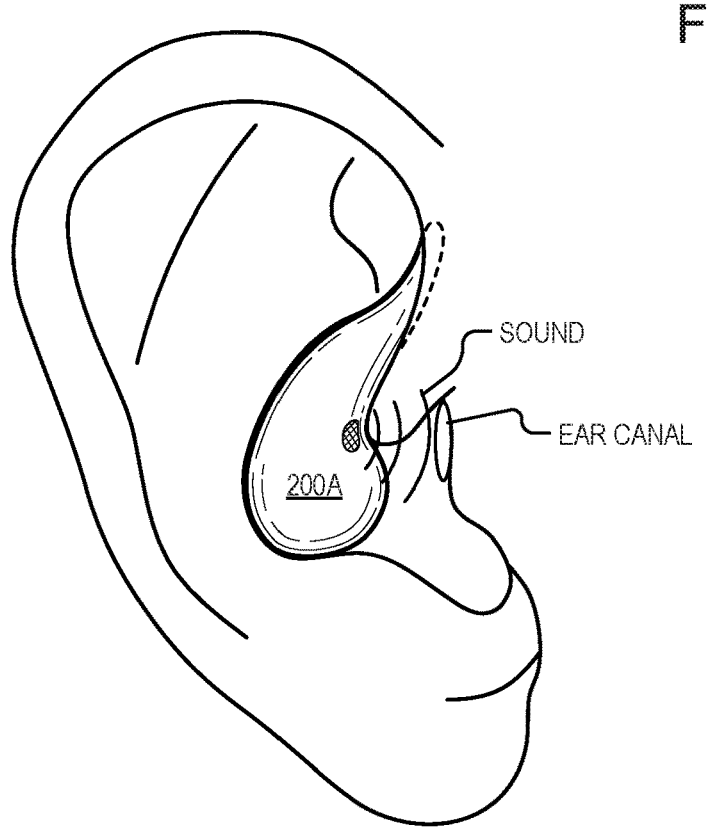

OPEN-CANAL IN-EAR DEVICE

TECHNICAL FIELD

This disclosure relates generally to in-ear devices.

BACKGROUND INFORMATION

Headphones are a pair of loudspeakers worn on or around a user's ears. Circumaural headphones use a band on the top of the user's head to hold the speakers in place over or in the user's ears. Another type of headphones are known as earbuds or earpieces and consist of individual monolithic units that plug into the user's ear canal.

Both headphones and ear buds are becoming more common with increased use of personal electronic devices. For example, people use head phones to connect to their phones to play music, listen to podcasts, etc. However, these devices can present a danger to the user: blocking out noise (e.g., car horn, shouts, etc.) that warns the user of oncoming harm. These devices may block this external noise because they occlude the ear canal.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

FIG. 2A illustrates an open-canal in-ear device, in accordance with an embodiment of the disclosure.

DETAILED DESCRIPTION

Figure 1:
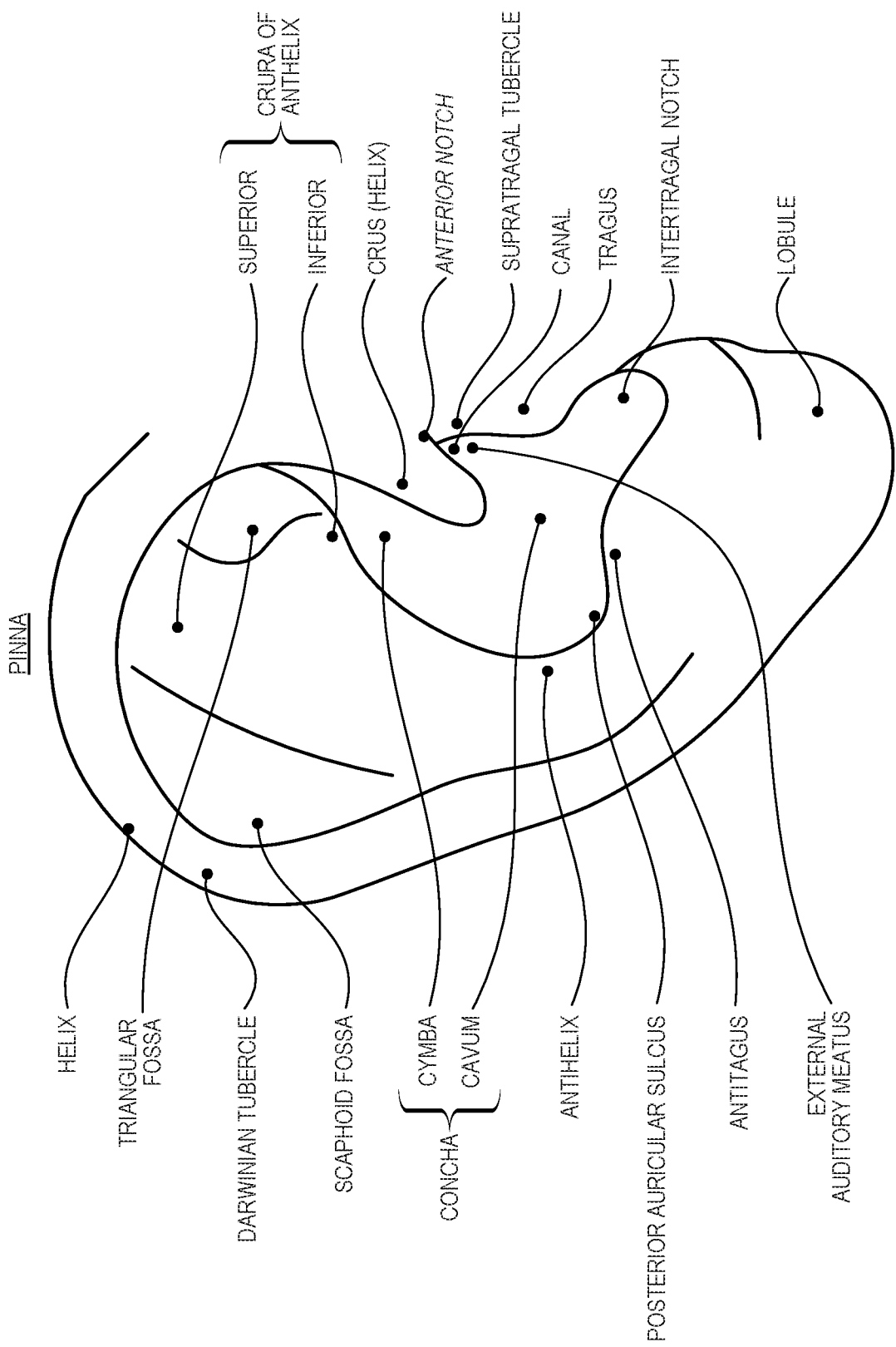
FIG. 1 is a cartoon illustration of human ear anatomy.

Embodiments of a system, apparatus, and method for an open-canal in-ear device are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Generally, there is a generous amount of space in the pinna (outer ear see FIG. 1) to fit an electronic device. Starting at the antitragus, and proceeding towards the antihelix, it is possible to fill most of the concha, all the way up past the anterior notch and the crus with an in-ear device. Embodiments of in-ear devices described herein sit in, or proximate to, this described opening, and do not occlude the canal. And in some embodiments, the in-ear device does not touch the tragus, or enter the intertragal notch. Accordingly, the device sits nestled in the pinna, completely free of obstructing the canal. Put another way, no part of the device is in or blocking the canal.

In some embodiments, in order to stay in place, the device may be custom molded to the shape of the pinna, which could be done by a combination of scanning the ear and custom manufacturing a bounding shape that nestles perfectly in the concha. In some embodiments, the whole device may be custom formed, but in other embodiments only part of the device may be custom formed (e.g., a replicable silicone sleeve).

As will be described, the in-ear device may include any number of sensors, including an inertial measurement unit (IMU), a transceiver for data transmission, a microcontroller, as well as an audio driver. Audio may be output closely to the ear, and therefore only need to be low volume (but may be able to be heard by someone standing close to the user, depending on the volume).

This type of open-canal custom-fit device would be excellent for providing information to the user's ears from a digital assistant, or from various apps on the user's phone, in addition to music in the right environment. The open nature of the design leads to a high degree of audio fidelity. Further, because the canal is not occluded, one would be able to hear ambient sounds naturally, solving a problem of in-ear canal devices which occlude the canal (e.g., preventing the user from hearing oncoming traffic or other dangers) and can be uncomfortable.

The following disclosure will describe the embodiments discussed above, and other embodiments, as they relate to the figures.

FIG. 1 is a cartoon illustration of human ear anatomy. The outer ear (i.e., pinna) anatomy depicted may be referenced in connection with how the in-ear device (see, e.g., FIGS. 2A and 2B) fits inside the ear. Shown are the location of the helix, triangular fossa, Darwinian tubercle, scaphoid fossa, concha (including the cymba and cavum), antihelix, posterior auricular sulcus, antitragus, external auditory meatus, crura of antihelix (both superior and inferior), crus, anterior notch, supratragal tubercle, canal, tragus, intertragal notch, and lobule.

FIG. 2A illustrates an open-canal in-ear device 200A, in accordance with an embodiment of the disclosure. It is appreciated that in-ear device 200A may come in a pair, where one device is a mirror image of the other to fit in both of the user's ears. The top diagram shows device 200A out of the ear, and the bottom diagram shows device 200A placed in the ear. As shown, the housing—which includes casing 203 (e.g., a hollow hard polymer, metal, ceramic, or the like) and optional molding 201 (e.g., a soft polymer, like silicone, sleeve or the like)—is shaped to be held in an ear of a user, and be positioned around the ear canal so the canal is unobstructed (e.g., external sound, like car horns, can pass straight into the ear canal without coming into contact with device architecture) by the in-ear device. An audio package 221 is positioned within the housing to project sound into the canal when in-ear device 200A is disposed in the ear. A controller (e.g., microcontroller) is disposed in the housing and coupled to audio package 221, and the controller includes logic that when executed by the controller causes in-ear device 200A to perform operations. As shown, these operations may include emitting the sound from audio package 221 towards the canal of the ear.

In the depicted example, the housing at least partially surrounds the canal and the housing is shaped to be held, at least in part, in the concha (see e.g., FIG. 1) of the ear. Thus, the housing is shaped to allow external sounds to enter the canal without obstructing the external sounds. In other words, an aperture is formed above the canal allowing sound to pass from the outside world into the ear without running into any other components. Further, the sound from audio package 221 travels through a distance of air to reach an entrance of the canal. Put another way, unlike other types of headsets that are mounted directly over the canal so that sound propagates directly into the canal, here the sound must travel a short distance to get from audio package 221 to the ear canal. In the depicted example, device 200A is somewhat "gourd" or "banana" shaped, but one of skill in the art having the benefit of the present disclosure will appreciate that device 200A may take other shapes that do not obstruct the ear canal.

In some embodiments, at least a portion of the housing (e.g., molding 201 or casing 203, or both) is custom shaped to fit in the ear. This may involve taking measurements of the ear (e.g., optically, mechanically, or the like), and sending the measurements to a manufacturing facility to receive custom in-ear devices. In some embodiments, casing 203 may be relatively one-size-fits-all (e.g., where a user just selects from a small, medium, or large device) but molding 201 is made from custom measurements. Molding 201 may be inexpensive, replicable, and formed to easily slide over casing 203. Thus, when molding 201 gets too "gunked up" it can be replaced at minimal cost to the user by ordering replacements, without having to replace the entire electronic device. Accordingly, the user gets a custom fit device for less cost since only the molding is truly custom fit to the ear.

As stated above, some or all of the housing may be flexible. For example molding 201 may be made from a soft polymer (e.g., silicone, rubber, or the like) for comfort during extended wear. In some embodiments, casing may also be somewhat flexible to "spring hold" in the user's ear. Put another way, casing may be compressed slightly when inserted into the ear, and it may remain there through a combination of friction fit and exerting force outward (e.g., interference fit) on the ear as it naturally tries to expand from the compressed state.

Figure 2B:
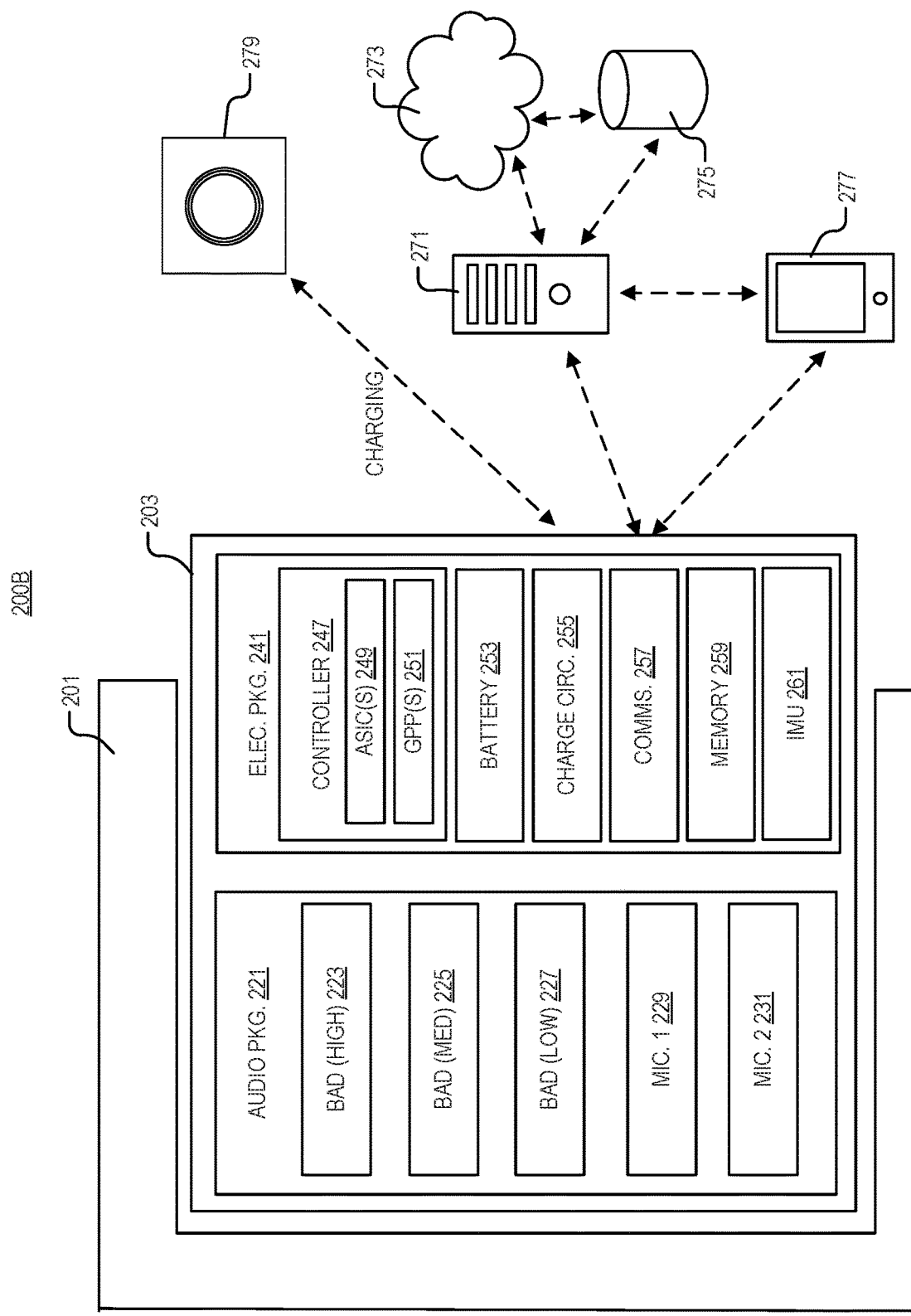
FIG. 2B illustrates a block diagram of the in-ear device of FIG. 2A, in accordance with an embodiment of the disclosure.

FIG. 2B illustrates a block diagram 200B of the in-ear device of FIG. 2A, in accordance with an embodiment of the disclosure. One of ordinary skill in the art will appreciate that this is merely a cartoon illustration, and that the device depicted is not drawn to scale (and not shown as their actual shape). Moreover, all of the electronic components are electrically coupled and may be mounted on the same or multiple coupled (e.g., with a bus or the like) printed circuit boards. The device depicted may have additional or fewer components, in accordance with the teachings of the present disclosure.

Like FIG. 2A, depicted are molding 201, casing 203, audio package 221, and electronics package 241. As shown, audio package 221 includes audio electronics such as one or more (e.g., three) balanced armature drivers (BADs)—a device that produces sound by vibrating a "reed" using an electromagnetic field—including a high-range BAD 221, a mid-range BAD 225, and a low range BAD 227 to produce high, medium, and low pitches, respectively. However, in other embodiments other sound emitting devices may be used (e.g., cone/coil based speakers, or the like). Audio package 221 also includes one or more microphones (e.g., MIC. 1 229, MIC. 2 231) which may have different sized diaphragms, materials, or orientations (e.g., one facing towards the external world, and one facing toward the user's ear canal). In some embodiments, microphones 229 and 231 may be used to record external sounds, and in response to receiving the external sound data with controller 247, the in-ear device may emit sound from audio package to reduce a magnitude (e.g., through destructive interference of the sound waves) of the external sound received by the ear drum in the user's ear. It is appreciated that the device herein may not only cancel sound, but amplify select sounds, translate language, provide virtual assistant services (e.g., the in-ear devices record a question, send the natural language data to cloud 273 for processing, and receive a natural language answer to the question), or the like. As stated, one or more of microphones 229 and 231 may face the user, or away from the user or both. Microphones 229 and 231 may be used to receive the user's speech (e.g., when in-ear device 200B is used to make a phone call) and transmit the recorded sound data to an external device. Microphones 229 and 231 may also be used to measure the volume of sound around the user, and adjust the volume of sound played to the user accordingly (e.g., in loud environments play louder sound to the user, while in quieter environments play softer sounds to the user).

Electronics package 241 includes a controller 247, which may include one or more application-specific integrated circuits (ASICs) 249 to handle specific signal processing tasks, and/or one or more general purpose processors (GPPs) 251. Controller may include logic (e.g., implemented in hardware, software, on the cloud/across a distributed system, or a combination thereof) that, when executed by the controller, causes the in-ear device to perform a variety of operations. Operations may include playing music/audio, performing noise cancellation computations, or the like. Battery 253 (e.g., a lithium-ion battery or the like) or other energy storage device (e.g., capacitor) is also included in electronics package 241 to provide power to controller 247 and other circuitry. Charging circuitry 255 (e.g., inductive charging loop, direct plug in with electrodes, or the like) is coupled to battery 253 to charge battery 253. Charging may be achieved by putting the device on charging pad 279 which includes inductive charging loops. Charging pad 279 may be disposed in a container to store in ear device 200B. Thus, when in-ear device 200B is in the container, the inductive charging loop charges the in-ear device 200B. Alternatively, the storage container may include direct charging electrodes.

In one embodiment, communications circuitry 257 (e.g., transmitter, receiver, or transceiver) is coupled to communicate with one or more external devices (e.g., wireless router, smart phone, tablet, cellphone network, etc.) via WiFi, Bluetooth, or other communication protocol.

In the depicted embodiment, electronics package 241 also includes an inertial measurement unit (IMU) 261 which may include one or more accelerometers, gyroscopes or the like, to measure the user's movement and record various aspects of the movement. In some embodiments, movement data (e.g., steps taken by the user) may be collected by IMU 261 and sent to one or more user external devices, or external devices acting on behalf of the user, to track the user's step count or other activity. Also IMU 261 may measure certain kinds of movement, and in response controller 247 may change the operation of the device (e.g., increase or decrease volume of sound output, turn on or off the device, etc.). It is appreciated that many of the same electronic devices may be included in both audio package 221 and electronics package 241, and that the electronic devices may be combined in any suitable manner, in accordance with the teachings of the present disclosure.

As stated above, controller 247 may include logic (or be coupled to remote logic) that performs real time, or near real time, noise cancellation, and sound augmentation functions. For example, local or remote logic may include machine learning algorithms (e.g., a neural network trained to recognize specific sound features, recurrent neural network, long short-term memory network, or the like), and other computational techniques (e.g., heuristics and thresholding), which may be used individually and in combination to recognize specific sounds and cancel or amplify these sounds. For example, the user may select never to hear a car horn honk again, unless its proximity is very close (e.g., as measured by volume or other technique). The machine learning model (and other algorithms) may be trained to filter and suppress car horns unless it is detected that the sound was within a threshold proximity of the user. Or if the user wanted to tune out a conversation, the user could prevent themselves from hearing the conversation, except if a certain word or phrase was spoken, then the system here could selectively pass that portion of the conversation through (e.g., smart cancellation of certain sounds). In some embodiments, the system may perform real time, or near real time, translation (e.g., where the user doesn't hear a third party speaking in Spanish, but instead hears the words in English in their ear). Processing of this sound modification functionality could occur locally, in the cloud, or a combination thereof, depending on the processing requirements and the hardware available.

As shown, communication circuitry 257 may communicate with a smart phone/tablet 277 or other portable electronic device, and/or one or more servers 271 and storage 275 which are part of the "cloud" 273. Data may be transmitted to the external devices from in-ear device 200B, for example, recordings from microphones 229/231 may be sent to smart phone 277 and uploaded to the cloud. Conversely, data may be downloaded from one or more external devices; for example, music may be retrieved from smart phone 277 or directly from a WiFi network (e.g., in the user's house). The smart phone 277 or other remote devices may be used to interact with, and control, in-ear device 200B manually (e.g., through a user interface like an app) or automatically (e.g., automatic data synch). As stated, in some embodiments, the one or more external devices depicted may be used to perform calculations that are processor intensive and send the results back to the in-ear device 200.

Figure 3:
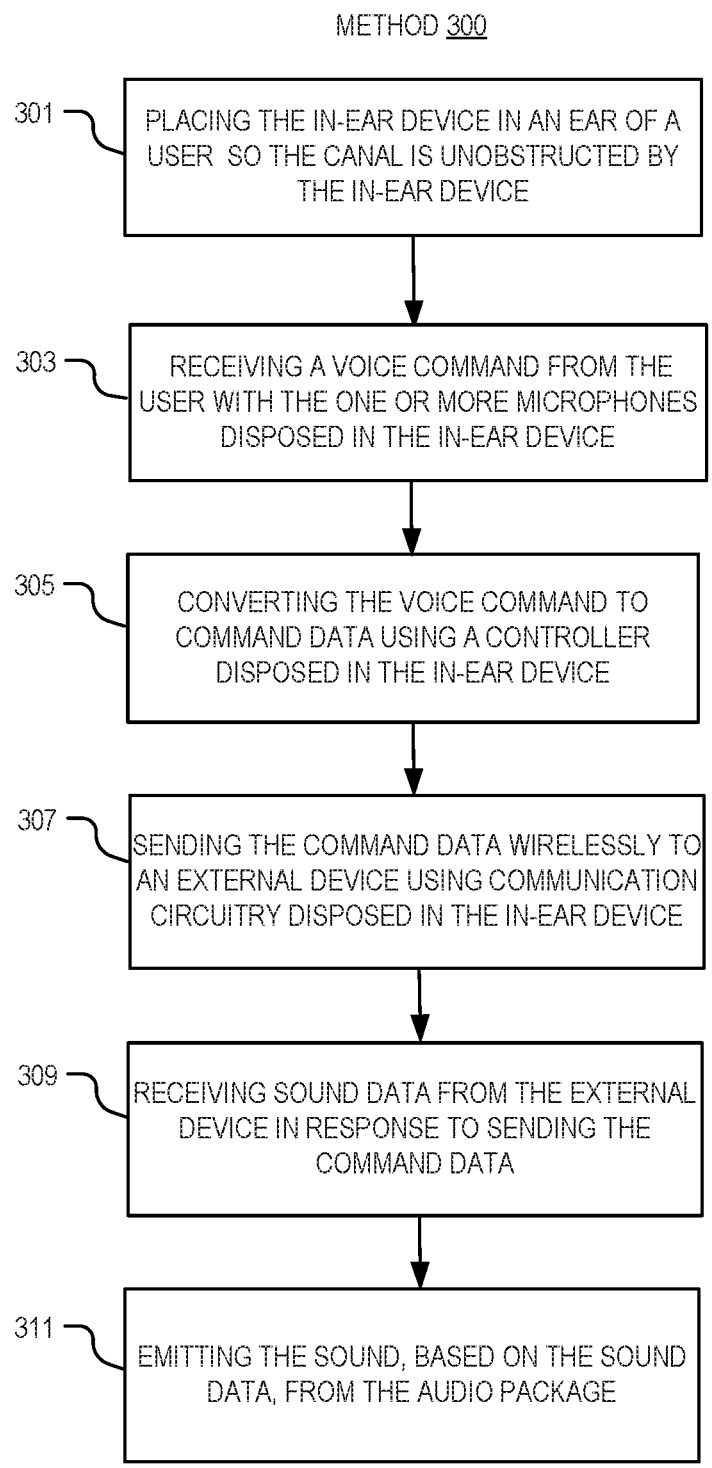
FIG. 3 illustrates a method of using the in-ear device of FIGS. 2A and 2B, in accordance with an embodiment of the disclosure.

FIG. 3 illustrates a method of using the in-ear device of FIGS. 2A and 2B, in accordance with an embodiment of the disclosure. One of ordinary skill in the art having the benefit of the present disclosure will appreciate that blocks 301-311 may occur in any order and even in parallel. Additionally, blocks may be added to, or removed from, method 300, in accordance with the teachings of the present disclosure.

Block 301 shows placing the in-ear device in an ear of a user so that the in-ear device is positioned around a canal of the ear so the canal is unobstructed by the in-ear device. Put another way, the housing is shaped to allow external sounds to enter the canal without obstructing the external sounds. In some embodiments, placing the in-ear device in the ear includes placing at least part of the device in a concha of the ear, so that the in-ear device is held in place with an interference or friction fit.

Block 303 illustrates receiving a voice command from the user with the one or more microphones disposed in the in-ear device. The voice command may be to play music, podcasts, send a message (e.g., by having the headphones send the message to a phone or other device, and have the remote device send the message via a wireless network), record sounds, or the like.

Block 305 depicts, converting the voice command to command data using a controller disposed in the in-ear device. In some embodiments, the analog audio signal from the microphone(s) may be converted into a digital command signal using an analog-to-digital converter or the like. The digital command data may be compressed or put in a standard format.

Block 307 shows sending the command data wirelessly to an external device using communication circuitry disposed in the in-ear device. In some embodiments, communications circuitry may include a wireless transceiver that sends information via WiFi, RFID, radio or the like.

Block 309 depicts receiving sound data from the external device in response to sending the command data. In some embodiments, the external device has performed complex computations (e.g., translated language, found the answer to a user's question, calculated directions to a location, etc.) and the external device will send data (i.e., sound data) back to the in-ear device, which will be displayed to the user as sound (e.g., "in response to your question about steak houses, there are three within walking distance"). See e.g., Block 313—emitting the sound (based on the sound data) to the user. In some embodiments, the sound includes at least one of speech, music, directions, instructions, or any other audio output that may be useful to the user.

The processes explained above are described in terms of computer software and hardware. The techniques described may constitute machine-executable instructions embodied within a tangible or non-transitory machine (e.g., computer) readable storage medium, that when executed by a machine will cause the machine to perform the operations described. Additionally, the processes may be embodied within hardware, such as an application specific integrated circuit ("ASIC") or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An in-ear device, comprising:
a housing having a size and a shape to fit in and be held in place by a concha of an ear without touching a tragus of the ear and while also leaving a canal of the ear unobstructed by the in-ear device, wherein the in-ear device and the housing are shaped to wear in the concha without extending into or covering the canal of the ear;
an audio package including a sound emitting device positioned within the housing to project sound from the sound emitting device into the canal when the in-ear device is disposed in the ear; and
a controller disposed in the housing and coupled to the audio package, wherein the controller includes logic that when executed by the controller causes the in-ear device to perform operations, including:
emitting the sound from the sound emitting device towards the canal of the ear.

2. The in-ear device of claim 1, wherein the housing at least partially surrounds the canal.

3. The in-ear device of claim 2, wherein the sound emitting device of the audio package is positioned in the housing to face towards an entrance of the canal but positioned external to the entrance of the canal when the in-ear device is worn in the concha and wherein the sound emitted from the sound emitting device of the audio package travels through a distance of air before reaching the entrance of the canal.

4. The in-ear device of claim 3, wherein the housing is shaped to allow external sounds to enter the canal without obstructing the external sounds.

5. The in-ear device of claim 1, wherein at least a portion of the housing is custom shaped to fit in the ear.

6. The in-ear device of claim 1, wherein the housing is flexible to press against insides of the concha to provide a spring hold to the concha to hold the in-ear device in place within the concha.

7. The in-ear device of claim 1, wherein the sound emitting device includes one or more balanced armature drivers to emit the sound.

8. The in-ear device of claim 1, further comprising communication circuitry disposed within the housing to send or receive wireless signals to or from an external device.

9. The in-ear device of claim 8, further comprising one or more microphones disposed within the housing and coupled to the controller, wherein the controller includes further logic that when executed by the controller causes the in-ear device to perform further operations, including:
receiving a voice command from the user with the one or more microphones;
converting the voice command to command data;
sending the command data to the external device using the communication circuitry;
receiving sound data from the external device in response to sending the command data; and
emitting the sound, based on the sound data, from the audio package.

10. The in-ear device of claim 9, wherein the controller includes a general purpose processor coupled to memory storing instructions, wherein the general purpose processor and memory are disposed within the housing shaped to wear in the concha without extending into or covering the canal of the ear.

11. The in-ear device of claim 1, further comprising:
a battery coupled to supply power to the controller and to the audio package; and
charging circuity coupled to charge the battery.

12. The in-ear device of claim 1, further comprising an inertial measurement unit disposed within the housing and coupled to the controller to measure movement of a head of the user.

13. A method of using an in-ear device, comprising:
placing the in-ear device in an ear of a user so that the in-ear device is positioned in a concha around a canal of the ear without obstructing the canal, wherein the in-ear device is shaped so as not to extend into or cover the canal or touch a tragus of the ear when worn in the concha; and
emitting sound from a sound emitting device disposed within the in-ear device, wherein the sound travels a distance through air into an opening of the canal.

14. The method of claim 13, wherein placing the in-ear device in the ear includes holding the in-ear device in the ear with an interference or friction fit.

15. The method of claim 14, wherein the housing is shaped to allow external sounds to enter the canal without obstructing the external sounds.

16. The method of claim 13, further comprising:
receiving a voice command from the user with one or more microphones disposed in the in-ear device; and
converting the voice command to command data using a controller disposed in the in-ear device.

17. The method of claim 16, further comprising:
sending the command data wirelessly to an external device using communication circuitry disposed in the in-ear device and coupled to the controller;
receiving sound data from the external device in response to sending the command data; and
emitting the sound, based on the sound data, from the sound-emitting device.

18. The method of claim 17, wherein the sound includes at least one of speech, music, directions, or instructions.

19. The method of claim 13, further comprising charging a battery disposed in the in-ear device with charging circuitry.

20. The method of claim 13, further comprising measuring a movement of the user with an inertial measurement unit disposed in the in-ear device.

21. The in-ear device of claim 1, further comprising:
a first microphone disposed within the housing and physically position to face towards the canal when the in-ear device is worn in the concha.

22. The in-ear device of claim 21, further comprising:
a second microphone disposed within the housing with a different orientation than the first microphone, wherein the second microphone is physically positioned to face outward from the ear toward an external world when the in-ear device is worn in the concha.

* * * * *